United States Patent

Miyoshi et al.

[11] Patent Number: 5,399,860
[45] Date of Patent: Mar. 21, 1995

[54] ELECTRON OPTIC COLUMN AND SCANNING ELECTRON MICROSCOPE

[75] Inventors: Motosuke Miyoshi, Minato, Japan; Katsuya Okumura, Poughkeepsie, N.Y.

[73] Assignee: Kabushiki Kaisha Toshiba, Kawasaki, Japan

[21] Appl. No.: 127,498

[22] Filed: Sep. 28, 1993

[30] Foreign Application Priority Data

Sep. 28, 1992 [JP] Japan .................. 4-258547

[51] Int. Cl.$^6$ .............................. H01J 37/22
[52] U.S. Cl. .................... 250/310; 250/306; 250/396 R
[58] Field of Search .............. 250/396 R, 397, 398, 250/400, 306, 310, 492.1

[56] References Cited

U.S. PATENT DOCUMENTS

| | | | |
|---|---|---|---|
| 3,566,071 | 2/1971 | Matchett et al. ............... | 219/121 |
| 4,694,178 | 9/1987 | Harte .......................... | 250/398 |
| 4,706,019 | 11/1987 | Richardson .................. | 250/310 |
| 4,820,927 | 4/1989 | Langner et al. ............... | 250/310 |
| 4,851,768 | 7/1989 | Yoshizawa .................... | 250/310 |
| 4,864,228 | 9/1989 | Richardson .................. | 250/311 |
| 4,958,079 | 9/1990 | Gray ........................... | 250/310 |
| 5,051,593 | 9/1991 | Ishihara ....................... | 250/396 ML |
| 5,229,607 | 7/1993 | Matsui et al. ................. | 250/310 |
| 5,270,643 | 12/1993 | Richardson et al. .......... | 324/158 R |

*Primary Examiner*—Jack I. Berman
*Assistant Examiner*—James Beyer
*Attorney, Agent, or Firm*—Foley & Lardner

[57] ABSTRACT

An electron microscope is provided which is reduced in total weight and shape. An electron gun cathode and an electron gun lens are enclosed in an electron gun chamber. An electron beam emitted from the electron gun chamber is converged by an objective lens to irradiate a wafer. Each of the electron gun lens and the objective lens is formed as an electrostatic field lens.

10 Claims, 3 Drawing Sheets

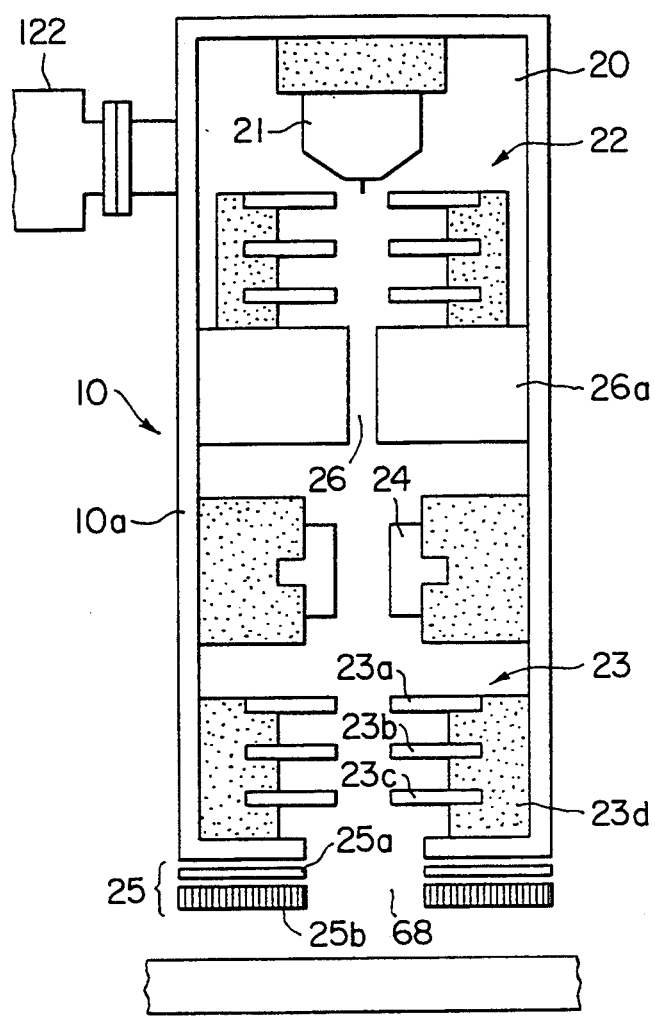
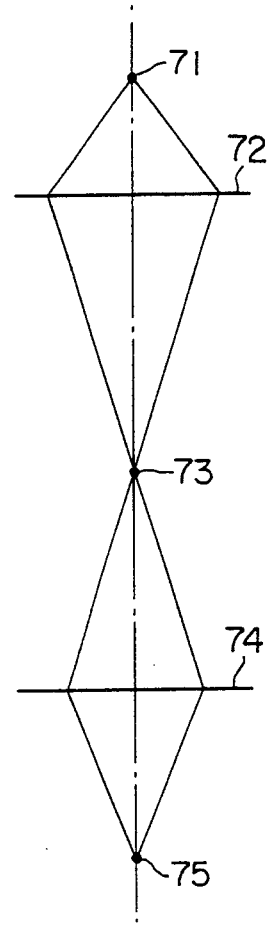
FIG. IA  FIG. IB

ELECTRON OPTIC COLUMN AND SCANNING ELECTRON MICROSCOPE

BACKGROUND OF THE INVENTION

1. Field of the Invention

The present invention relates to a scanning electron microscope for observing and measuring a fine pattern formed on a wafer in the production process of integrated circuits, and to an electron optic column used therein.

2. Related Background Art

Scanning electron microscopes for observation of semiconductor wafers, for example represented by the dimension measurement system (dimension SEM) using an electron beam (EB), are increasing their size year by year with increasing diameter of the wafer. In the basic structure of an EB dimension measurement system which is generally used at present, an electron optic column (column) is mounted on a sample chamber enclosing a wafer.

The electron optic column comprises an electron gun enclosed in an electron gun chamber, an ion pump for keeping the electron gun chamber at high vacuum, a condenser lens and an objective lens for converging an electron beam emitted from the electron gun into a fine beam, and a secondary electron detector.

The secondary electron detector could be placed outside the column but is often constructed recently as incorporated into the column above or right below the objective lens to improve the detection efficiency for observation at higher resolution.

There are an XY stage (or XYZ stage if oblique observation is necessary) provided inside the sample chamber and a wafer placed on the XY stage. Motor drive controls movement of the XY stage as will be described below. In an EB dimension measurement system, the upper stage will be referred to as a Y-axis stage and the lower stage as an X-axis stage. The operational theory and construction will be described below.

The X-axis stage is held by an X-axis cross roller guide and slides to move in the X direction. In more detail, the X-axis cross roller guide is fixed on a stationary platen and the X-axis stage is given a driving force in the X direction by an X-axis pulse motor and an X-axis ball screw fixed to the stationary platen so as to slide to move on the X-axis cross roller guide.

The Y-axis stage is mounted on a Y-axis cross roller guide and is moved in the Y direction by a Y-axis pulse motor and a Y-axis ball screw not shown. The movement of the XY stage is determined by a combination of these operations.

In order to observe the entire surface of a wafer, the XY stage requires a movement space which is at least a double of wafer size along the both X and Y axes. In other words, the XY stage needs a movement space of at least 40 cm×40 cm for 8 inch wafer (in diameter of 20.32 cm). In actual applications a transfer mechanism of driving force is necessary in addition to the above arrangement, so that the necessary space becomes larger. Although the weight of the XY stage differs considerably depending upon demanded accuracy, the XY stage alone for observation of 8 inch wafers, for movement only in the X, Y directions and with stop accuracy of ±2–3 μm has a weight of about 20 Kg.

As the size of the wafer increases, a pattern becomes finer. Then, the movement accuracy and the stop accuracy required of the XY stage must be enhanced, and the movement speed must be increased. Namely, as the wafer size increases, a movement time from edge to edge on the wafer increases if the movement speed is unchanged. To satisfy these requirements, the structure of the XY stage becomes more and more complex, resulting in a size increase of the XY stage. The size increase in turn results in an increase of the entire floor space (floor area) of the scanning electron microscope. The scanning electron microscopes are actually used under the essential condition of inprocess control (to keep the wafer within a clean room). Considering the scanning electron microscope used as set in clean room, the size increase of the scanning electron microscope will raise a serious problem. Nevertheless, the size of the scanning electron microscope rather tends to increase because of the reasons as described above.

The basic reason why the size of scanning electron microscope, specifically the area of the floor space, increases with an increase in diameter of the wafer is that the entire surface of the wafer is to be observed by moving the XY stage while keeping the column fixed. As far as this method is maintained, the stroke of the XY stage increases at least by a double of diameter increase as the diameter of the wafer increases (an area increase becomes four times larger than the diameter increase).

One of the major factors to employ such apparatus arrangement is that the conventional columns are large in shape and weight. Describing this point in more detail, there are the following causes: (1) electromagnets are heavy in the conventional columns using magnetic field type lenses; (2) an evacuation pump for obtaining high vacuum is heavy.

The conventional scanning electron microscopes (SEM) employ the magnetic field type lenses. A magnetic field type lens converges an electron beam by the lens effect of a magnetic field produced by an electromagnet, which needs a magnetic yoke for shaping the magnetic field from its theoretical structure. In the normal SEM currently used, the lens construction includes three-stage focusing lenses (a stage of objective lens and two stages of condenser lenses). Additional lenses should be prepared for alignment correction, for astigmatism correction and for beam scanning in addition to the lenses for focusing. Accordingly, the total weight including the housing of the column will be at least 20 kg–30 Kg.

A specific feature of the magnetic field type lenses is excellent aberration property on average in a wide energy range (approximately 5 keV–20 keV in normal applications of SEM). Also, the magnetic field type lenses have been used in actual applications since the electron microscopes. Thus, the magnetic field type lenses are widely used for these reasons. However, if the utility is limited to the observation of the wafer, the circumstances would change. Samples of semiconductor wafer require observation with electron beam of far lower energy than in a conventional procedure to avoid degradation of property by irradiation of electron beam (irradiation damage) or to relieve charge-up in the observation object, because most of observed objects are insulators. Specifically, the observation is carried out with an electron beam of low energy of 0.5 keV14 1.5 keV.

A short focus and high excitation type lens is necessary to obtain an excellent aberration property in a low energy region if the magnetic field type lens is employed. Then, a strong magnetic field is necessarily produced. The excitation current of the objective lens must be increased in particular. Thus, the objective lens inevitably increases its size and weight. High ampere-turns are necessary to produce a strong magnetic field, which would cause a problem of heating by the current and therefore require water cooling for lowering the temperature of lenses.

Next described is a problem in the vacuum evacuation system. The problem mainly arises from a vacuum pump for evacuating the electron gun chamber. As described before, focusing of low energy electrons is necessary for observation of semiconductor samples. As the electron energy becomes lower, the influence of aberration of a lens, specifically of the objective lens, for example the influence of chromatic aberration, increases, making the focusing of the beam more difficult as a result. To compensate it, an electron gun of high brightness type is employed.

A field emission type electron gun has high brightness but little energy dispersion of emitted electrons. Therefore, it is most suitable for this purpose, but needs a high vacuum in the electron gun chamber to ensure a stable operation, which is a drawback. Specifically, a cold-cathode type electron gun (CFE) needs a high vacuum of not less than $10^{-10}$ Torr and a thermal field emission type electron gun (TFE) needs a high vacuum of not less than $10^{-9}$ Torr. For this purpose, the conventional procedure employs an arrangement that only the electron gun is independently evacuated by an ion pump.

As detailed above, the following points were a hindrance to size reduction and weight reduction of an apparatus for observing large samples such as wafers.

(1) The XY stage on which a large sample (wafer) is mounted must be moved while the column is kept fixed, which theoretically increases the scale of the sample chamber.

(2) The column must be fixed on the sample chamber, because the column is large and heavy.

(3) The column is large and heavy, because the column includes the magnetic field type lenses.

SUMMARY OF THE INVENTION

The present invention has been accomplished taking the above-discussed points into account. It is an object of the present invention to provide a scanning electron microscope compact in size, light in weight and especially small in floor space, which enables observation of a large sample such as a wafer large in diameter, and to provide an electron optic column used therein.

An electron optic column of the present invention comprises:
a case having an aperture;
an electron emission source for emitting an electron beam and an electron gun lens for converging the electron beam, which are enclosed in an electron gun chamber provided opposite to the aperture in the case;
a focusing lens provided outside the electron gun chamber in said case, for focusing the electron beam emitted from said electron gun chamber; and
a vacuum pump provided for said electron gun chamber, for creating a vacuum in the electron gun chamber;
wherein each of said electron gun lens and said focusing lens is formed as an electrostatic field lens.

A scanning electron microscope of the present invention is so arranged that an electron optic column as described above is located above a sample table, wherein the sample table is fixed and the electron optic column is movable in the horizontal direction.

A scanning electron microscope of the present invention is so arranged that an electron optic column as described above is located above a sample table, wherein the sample table and the electron optic column both are movable in the horizontal direction.

A scanning electron microscope of the present invention is so arranged that a plurality of electron optic columns as described above are located above a sample table.

In the present invention the electrostatic field lens is employed as the electron gun lens or as the focusing lens, whereby the whole electron optic column can be made lighter and smaller.

BRIEF DESCRIPTION OF THE DRAWINGS

FIG. 1A is a side cross section to show an electron optic column according to the present invention;

FIG. 1B is a ray diagram of the electron optic column shown in FIG. 1A;

DESCRIPTION OF THE PREFERRED EMBODIMENTS

Figure 2:
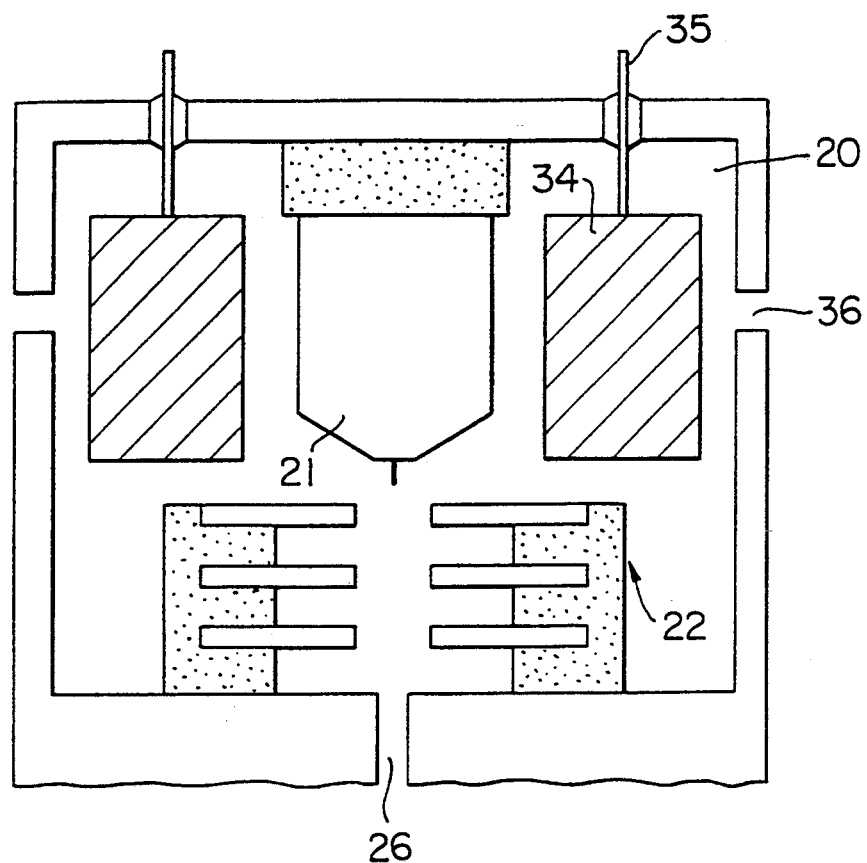
FIG. 2 is an enlarged side cross section to show an electron optic column provided with a getter pump.

The embodiments of the present invention will be described in detail with reference to the accompanying drawings.

FIGS. 1A and 1B are drawings to show the first embodiment of the present invention. FIG. 1A shows an electron optic column according to the present invention and FIG. 1B shows a ray diagram of the electron optic system, corresponding to FIG. 1A.

In FIG. 1A, an electron optic column (column) 10 has a case 10a to which an ion pump 122 is mounted, and an electron gun chamber 20 is defined by a diaphragm 26a having a sleeve 26 in the upper portion of the case 10a. There are an electron gun cathode (electron emission source) 21 and an electron gun lens 22 set in the electron gun chamber 20.

The electron gun cathode 21 is of the field emission type if high resolution is required. This is because the field emission type electron gun can provide high brightness to permit an electron beam to be focused in smaller size and have little energy dispersion of emitted electrons, whereby it can suppress the beam spread due to chromatic aberration of lenses, especially due to that of an objective lens.

The lens system is mainly composed of the electron gun lens 22 as described above, an objective lens 23, and a multi-pole lens 24 for scanning of a beam and for correction of astigmatism. The electron gun lens 22 and the objective lens 23 are basically constructed as an electrostatic field lens, which are different only in operation conditions.

The objective lens 23, which is formed as an electrostatic field lens, is constituted by a plurality of cylindrical or disk electrodes combined as shown in FIG. 1A. The objective lens 23 shown in FIG. 1A has the simplest structure and is called an einzel lens, which is composed of three electrodes 23a, 23b, 23c. The first electrode 23a is biased to the ground potential, the second electrode 23b to a negative potential in order to form a lens electric field, and the third electrode 23c to the earth potential. The electrodes 23a, 23b, 23c are assembled in a holder 23d of insulator such as ceramics.

A secondary electron detector 25 using a microchannel plate is directly mounted on the lower surface of case 10a of the column 10. The secondary electron detector 25 increases secondary electrons by a microchannel plate 25a and detects the increased electrons as current by an anode plate 25b. The sleeve 26 decreases the conductance in the electron gun chamber 20 so as to prevent residual gas entering the case 10a from the sample chamber 41 (FIG. 3) through a lower end aperture 68, from flowing into the electron gun chamber 20.

The operation of the lens system will be next described with the ray diagram shown in FIG. 1B. An electron beam emitted from an electron gun cathode point 71 starts being converged at an electron gun lens point 72 to form a crossover 73 at the central position of the multi-pole lens 24. Further, the electron beam starts being demagnified from the center 74 of the objective lens 23 to form a reduced image on a sample surface 75.

As seen from FIGS. 1A and 1B, the column 10 constructed employing the electrostatic field lenses is compact, and lighter as compared to one employing the magnetic field type lenses. Specifically, the column 10 has a total length of not more than 200 mm, an outer diameter of not more than 50 mm, and a weight of 2-3 Kg. These specific values were obtained for the column 10 without a vacuum evacuation system.

As described above, the present embodiment is effective to reduce the size and the weight of the column 10. The aberration in the present embodiment may be expected as equivalent to or lower than that in conventional columns with magnetic field type lenses in the operation range of low acceleration voltage. The acceleration voltage for operation must be low, i.e., about 1 kV to prevent electron irradiation damage of a semiconductor wafer and to prevent charge (charge-up) on the wafer. Since high acceleration voltage is unnecessary, the features of the column including the electrostatic field lenses may be fully utilized.

The second embodiment of the present invention is next described with FIG. 2.

As described above, the evacuation from the electron gun chamber 20 was carried out by the ion pump 122. This is because the ion pump is suitable for obtaining a high vacuum necessary for the stable operation of the field emission type electron gun without causing vibration.

In the second embodiment the electron gun chamber 20 is evacuated using a non-evaporable getter pump, as shown in FIG. 2. This enables a weight reduction of the apparatus, and a high vacuum of $10^{-9}$ Torr to $10^{-10}$ Torr can be readily obtained by the getter pump. The getter pump is formed of a sintered body of Zr, Fe, Cu, etc., which evacuates residual gas by physical adsorption of gas molecules, or by chemical adsorption thereof depending upon a kind of gas and which is compact but high in evacuation speed. The use of the getter pump can achieve the size reduction and the weight reduction of evacuation system, which permits the evacuation system to be constructed without affecting the size and weight of column 10. FIG. 2 is an enlarged view of the electron gun chamber to show the evacuation method by the getter pump. There are the electron gun cathode 21 and the electron gun lens 22 set in the electron gun chamber 20, which are isolated by the sleeve 26 to maintain a high vacuum. The getter pump 34 is formed in the cylindrical shape and is arranged to surround the electron gun cathode 21. The getter pump 34 is connected to an external current source through lead wires 35.

The lead wires 35 are for supplying an electric current to a heater (not shown) buried in the getter pump 34. The heater heats the getter pump 34 at a high temperature (approximately 400°-500° C. though different depending upon materials) for heating during evacuation operation of the getter pump 34 and for activation per several hundred hours. The getter pump 34 could be operated at ordinary temperature, which would increase the frequency of activation. Activation means degassing gas molecules adsorbed in the getter pump 34 and re-activating the getter pump.

There are holes 36 for evacuation made through the wall of the electron gun chamber 20. The holes 36 are perforated for two purposes. The first purpose is auxiliary evacuation which is essential for the getter pump, because the getter pump 34 cannot start operating at atmospheric pressure. The getter pump is preferably actuated normally at about $10^{-5}$–$10^{-6}$ Torr, and therefore the electron gun chamber 20 must be evacuated through the holes 36. The other purpose is evacuation of degassed molecules to the outside during activation.

Since the compact and light column 10 is provided including the evacuation system, there is no need to move a large XY or XYZ stage for observation of the wafer while the column 10 is kept fixed as in the conventional procedure. Therefore, the column may be moved while keeping the stage fixed.

Figure 3:
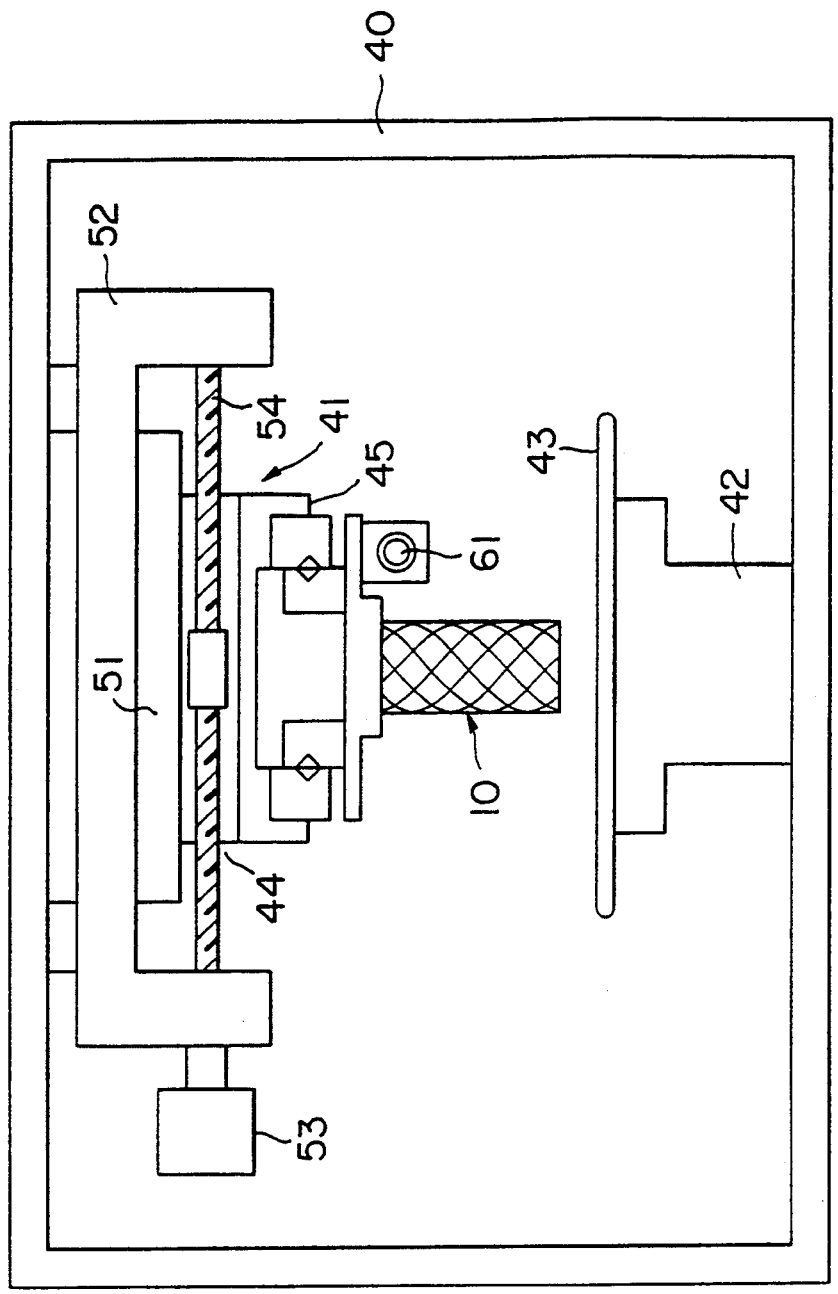
FIG. 3 is a schematic overall view to show a scanning electron microscope according to the present invention.

The third embodiment of the present invention is next described with FIG. 3. In FIG. 3, the column 10 shown in the first embodiment or in the second embodiment is set on a sample table 42, constituting a scanning electron microscope on the whole. The following describes this scanning electron microscope.

In FIG. 3, a stage (sample table) 42 is provided inside a sample chamber 40 and a wafer 43 is mounted on the stage 42. The stage 42 is fixed without a moving mechanism. An XY movement mechanism 41 is installed in the upper portion in the sample chamber 40. The operational mechanism of XY movement mechanism 41 is the same as that of the XY stage of the conventional dimension measurement system.

In the XY movement mechanism 41 shown in FIG. 3, the upper stage is an X-axis stage and the lower stage is a Y-axis stage. An X-axis movement mechanism 44 is held by an X-axis cross roller guide 51 provided in the upper portion of the sample chamber 40 and moves along the X-axis cross roller guide 51 in the X direction. A driving force for movement is supplied by a pulse motor 53 and a ball screw 54 mounted on a stationary platen 52 fixed in the upper portion of the sample chamber so that the X-axis movement mechanism 44 slides to move along the X-axis cross roller guide 51 in the X direction. A Y-axis movement mechanism 45 is mounted below the X-axis movement mechanism 44. A driving force for movement in the Y direction is given by a Y-axis pulse motor (not shown) and a Y-axis ball screw 61 so that the Y-axis movement mechanism 45 slides to move along the Y-axis cross roller guide 62.

The column 10 shown in FIG. 1 or in FIG. 2 is installed below the Y-axis movement mechanism 45. A movement space of this column 10 can be identical to the size of sample, for example only 8 inches if the wafer has a diameter of 8 inches. In contrast, if the stage is arranged to move, a movement space of the stage should be 8 inches×2=16 inches. Since the column 10 is light as described, the XY moving mechanism 41 used herein is small in size and simple in structure.

The structure shown in FIG. 3 is of a type in which sequential observation and movement is repeated on the wafer 43, using the single column 10. If an area of the wafer 43 is considerably larger than the observation region of column, a plurality of portions on the same wafer 43 can be observed at the same time by a plurality of the columns 10, which are juxtaposed on the XY movement mechanism 41.

Further, if the conventional XY stage is employed in place of the stage 42, the column 10 and the XY stage can be moved at the same time to double the movement speed, whereby the inspection time may be reduced. In this case, increase in accuracy of the XY movement mechanism 44 for the column 10 is far more effective than increase in movement accuracy of the conventional XY stage. This is because the column 10 is lighter and the XY movement mechanism 44 is simpler in structure as described, which makes the increase of accuracy easier.

Although the description concerns an example of plane observation over the wafer surface in the above embodiments, oblique observation of wafer is also possible by setting an inclination mechanism (not shown) below the XY movement mechanism 41.

As described above, the present embodiment is so arranged that the wafer 43 is fixed but the column 10 is movable. Then, the movement space necessary for observation of the entire area on the wafer 43 is reduced to a half of that in the arrangement in which the wafer 43 is moved, and the size of the sample chamber 40 may be made smaller. Since the size of the sample chamber 40 determining the size of the entire body of the scanning electron microscope is made smaller, the size of the entire apparatus can be reduced. Also, the compact column 10 can be used, and with a plurality of such columns a plurality of portions on the same wafer 43 can be observed at the same time. Further, the relative movement speed can be increased by combining the movement of the column 10 with the movement of the stage, whereby a time necessary for inspection can be reduced.

As described above, the present invention can achieve the weight reduction and the size reduction of the entire electron optic column. Because of this, the weight-reduced and size-reduced electron optical column can be moved in the horizontal direction while the sample table is fixed, whereby the size of the movement mechanism can be made smaller. Further, the reduction of inspection time can be attained by moving both the sample table and the electron optic column. In addition, the reduction of inspection time can be also achieved by setting a plurality of electron optic columns above the sample table.

What is claimed is:

1. A scanning electron microscope comprising:
   a sample chamber;
   a sample stage provided within the sample chamber, for holding a wafer;
   an electron optic column provided opposite to the sample stage within the sample chamber, for irradiating the wafer with an electron beam; and
   an X-Y movement mechanism provided within the sample chamber, for moving the electron optic column on a plane parallel to the wafer.

2. A scanning electron microscope according to claim 1, wherein the electron optic column comprises:
   a case having an aperture;
   an electron emission source for emitting the electron beam and an electron gun lens for converging the electron beam, which are enclosed in an electron gun chamber provided opposite to the aperture in the case;
   a focusing lens provided outside the electron gun chamber in said case, for focusing the electron beam emitted from said electron gun chamber; and
   a vacuum pump provided for said electron gun chamber, for creating a vacuum in the electron gun chamber;
   wherein each of said electron gun lens and said focusing lens is formed as an electrostatic field lens.

3. A scanning electron microscope according to claim 2, wherein
   said electron gun chamber in the case is defined by a diaphragm having a sleeve to decrease a conductance in the electron gun chamber.

4. A scanning electron microscope according to claim 2, wherein
   a multi-pole lens for scanning of the electron beam and for correction of astigmatism is provided between the electron gun chamber and the focusing lens.

5. A scanning electron microscope according to claim 2, wherein
   a secondary electron detector is provided outside said aperture of the case.

6. A scanning electron microscope according to claim 2, wherein
   said vacuum pump is a getter pump.

7. A scanning electron microscope according to claim 2, wherein
   said vacuum pump is an ion pump.

8. A scanning electron microscope according to claim 5, wherein
   said secondary electron detector comprises a microchannel plate for increasing secondary electrons and an anode plate for detecting as an electric current the secondary electrons increased by the microchannel plate.

9. A scanning electron microscope according to claim 1, wherein
   both the sample stage and the electron optic column are movable in the plane.

10. A scanning electron microscope according to claim 1, wherein a plurality of electron optic columns are provided within the sample chamber.

* * * * *